United States Patent [19]

Rao

[11] Patent Number: 5,701,143
[45] Date of Patent: Dec. 23, 1997

[54] CIRCUITS, SYSTEMS AND METHODS FOR IMPROVING ROW SELECT SPEED IN A ROW SELECT MEMORY DEVICE

[75] Inventor: G. R. Mohan Rao, Dallas, Tex.

[73] Assignee: Cirrus Logic, Inc., Fremont, Calif.

[21] Appl. No.: 381,189

[22] Filed: Jan. 31, 1995

[51] Int. Cl.[6] ................................................. G11C 11/40
[52] U.S. Cl. ........................ 345/185; 345/196; 345/201; 395/427; 395/410; 395/438; 395/404; 365/230.03; 365/230.06
[58] Field of Search ........................ 345/185, 196, 345/201; 395/427, 410, 438, 404; 365/230.03, 230.06

[56] References Cited

U.S. PATENT DOCUMENTS

| | | | |
|---|---|---|---|
| 5,034,917 | 7/1991 | Bland et al. | 364/900 |
| 5,132,932 | 7/1992 | Tobrta | 365/222 |
| 5,365,479 | 11/1994 | Hoang et al. | 365/189.29 |
| 5,379,264 | 1/1995 | Kobayashi et al. | 365/230.06 |
| 5,426,601 | 6/1995 | Agata et al. | 365/226 |
| 5,442,588 | 8/1995 | Runas | 365/222 |
| 5,452,244 | 9/1995 | Rao | 365/149 |
| 5,455,526 | 10/1995 | Runas | 326/81 |
| 5,500,819 | 3/1996 | Runas | 365/189.05 |
| 5,506,810 | 4/1996 | Runas | 365/230.03 |

*Primary Examiner*—Mark R. Powell
*Assistant Examiner*—Vincent E. Kovalick
*Attorney, Agent, or Firm*—Winstead Sechrest & Minick

[57] ABSTRACT

A memory device 200 is provided which includes an array 202 of rows and columns of memory cells 201. Row decoder circuitry 206 is provided for selecting a given row of cells 201 for access. Circuitry 208, 209 is included for providing a selected one of a plurality of supply voltages to the row decoder circuitry 206, a first positive voltage provided during an active state of the row decoder circuitry 206 and a second positive voltage provided during an inactive state of the row decoder circuitry 206.

20 Claims, 2 Drawing Sheets

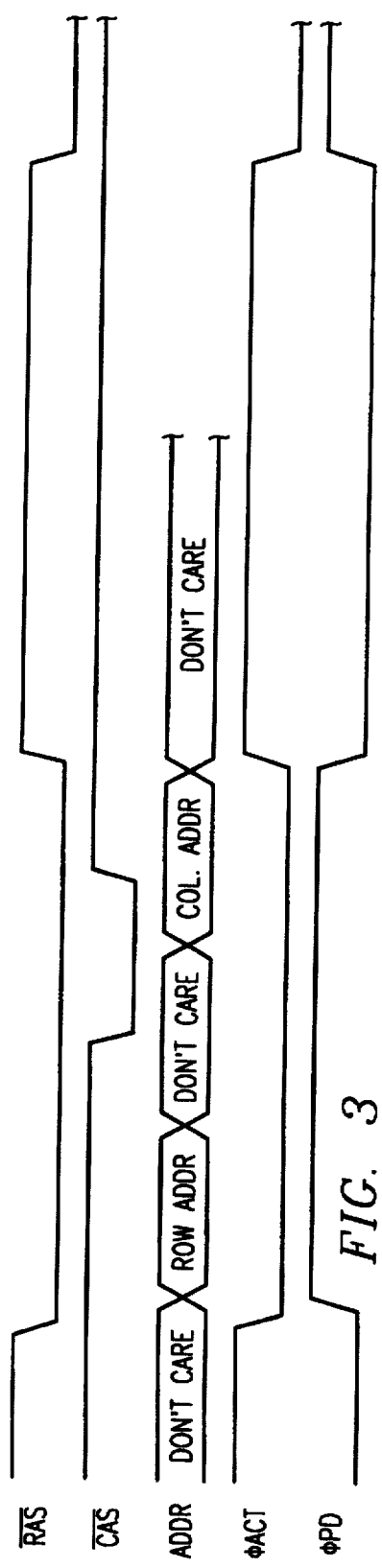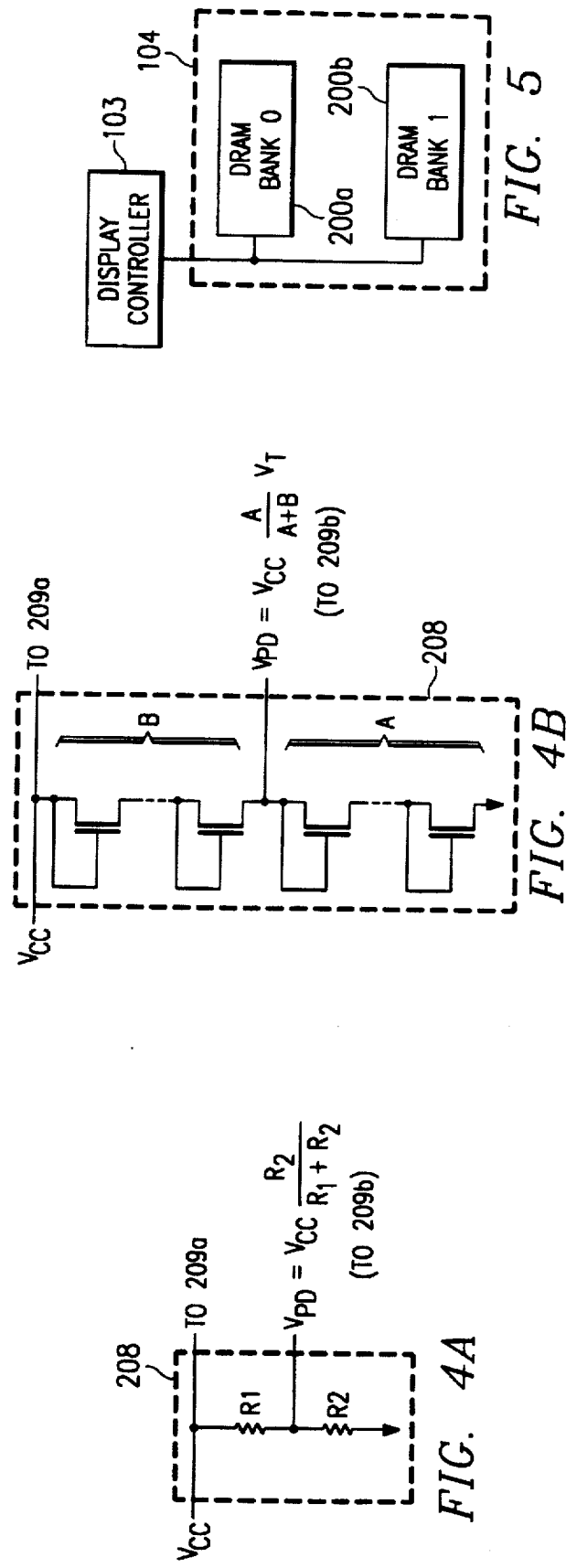

CIRCUITS, SYSTEMS AND METHODS FOR IMPROVING ROW SELECT SPEED IN A ROW SELECT MEMORY DEVICE

TECHNICAL FIELD OF THE INVENTION

The present invention relates in general to electronic memories and in particular to circuits, systems and methods for improving row select speed in a memory device.

BACKGROUND OF THE INVENTION

The typical dynamic random access memory device (DRAM) includes an array of rows and intersecting columns of memory cells, row control circuitry for activating an addressed (selected) row of cells in the array, a bank of sense amplifiers coupled the columns for reading and writing data into the cells along the activated row, and column control circuitry for controlling access to addressed cells along the activated row through the sense amplifiers. Most DRAMs employ dynamic row control circuitry to charge the addressed row in the cell array and ground the remaining deselected rows when read, write, or refresh operations are being performed. When the read, write or refresh operations are completed, substantially all of the row decoder circuitry is deactivated by decoupling the critical nodes of the dynamic circuitry from the supply voltage and bringing them to ground. During the next active period, the row decoder circuitry is recoupled to the power supply and the critical nodes recharged. While this technique saves significant amounts of power, it disadvantageously reduces operating speed (namely, it increases the time to access to a random memory location).

The majority of DRAMs are fabricated using metal oxide semiconductor (MOS) technologies (p-channel, n-channel and CMOS). When an appropriate turn-on voltage is applied to the gate of a MOS transistor, approximately 25% of all the time required to turn-on the transistor is used to bring the transistor from completely turned-off to 10% of full turn-on (saturation). In contrast, the transition from 10% to 90% of full turn-on consumes about 50% of the turn-on time for the typical MOS transistor. This non-linear characteristic is primarily the result of a combination of the voltage dependent junction capacitance between the transistor channel and the source and drain regions, and the voltage independent gate capacitance as the voltage across the junctions increases. Additionally, when the turn-on voltage is applied, time is required to charge the transistor gate capacitance before current can flow through the channel. As a result, when a typical DRAM row decoder circuit reactivates prior to a read, write or refresh operation, valuable time required for the circuit's transistors to transition from fully turned-off to 10% turn-on and the overall circuit operating speed is significantly reduced.

Thus, the need has arisen for circuits, systems and methods for improving the performance of the dynamic row decoder circuitry typically used in DRAMs by reducing the effective turn-on time of the transistors from which such circuits are constructed. In particular, such circuits systems and methods should reduce the time required to these transistors to transition from the turned-off state to 10% of turn-on. Further, these systems, circuits and methods should be applicable to the dynamic row decoder circuits used in other types of memory devices such as SRAMs (static random access memory devices) and VRAMs (video random access memory devices).

SUMMARY OF THE INVENTION

In general, according to the principles of the present invention, the row decoder circuitry typically found within a DRAM or SRAM memory device is selectively provided with one of a plurality of available supply voltages, depending on the state of the row decoder circuitry. In the preferred embodiment, when the row decoder in an active state (i.e., RAS is low) and a row of an associated array of memory cells is being selected for access in anticipation of a read, write, or refresh operation, the row decoder circuitry is provided with the full supply voltage available within the device (i.e., $V_{CC}$). When the row decoder circuitry is inactive (i.e., RAS is high and no read, write or refresh operations are being performed) the row decoder is provided with a second "power-down" supply voltage. In the preferred embodiment, the power-down supply voltage is generated by dividing down the full supply voltage made available to the chip.

According to a first embodiment of the principles of the present invention, a memory device is provided which includes an array of rows and columns of memory cells, with each row associated with a conductive wordline. Row decoder circuitry is coupled to the wordlines for selecting a row of the array of the cells for access. Circuitry is also provided for providing a selected one of a plurality of supply voltages to the row decoder circuitry, a first positive voltage provided to the row decoder circuitry during an active state of the row decoder circuitry and a second positive voltage provided to the row decoder circuitry during an inactive state of the row decoder circuitry.

According to a second embodiment of the principles of the present invention, a memory device is provided which operates in response to a predetermined supply voltage. The memory device includes an array of rows and columns of memory cells and a row decoder for accessing a selected one of the rows, the row decoder circuitry active during an active period of a row address strobe and inactive during an inactive period of the row address strobe. A DC to DC converter is provided to generate a power-down supply voltage from the device supply voltage. Circuitry is also included for providing the device supply voltage to the row decoder during the active period and the power-down supply voltage to the row decoder during the inactive period.

The principles of the present invention are also embodied in a data processing system including a controller and a memory bank, the memory bank having an array of rows and columns of memory cells and row decoder circuitry for selecting a given one of the rows for access. The system further includes circuitry for providing a selected one of a plurality of supply voltages to the row decoder circuitry, a first positive voltage provided to the decoder circuitry in anticipation of a selection by the row decoder circuitry of a row in the array for access and a second positive voltage provided to the row decoder circuitry during an inactive state of the row decoder circuitry.

The principles of the present invention are also embodied in methods for operating memory devices. A first method is directed to operating a memory device including an array of rows and columns of memory cells and row decoder circuitry for accessing the cells of a selected one of the rows. A first positive supply voltage is provided to the decoder circuitry during an active state of the row decoder circuitry. A second positive supply voltage is provided to the decoder circuitry during an inactive state of the row decoder circuitry.

A second method according to the principles of the present invention is directed to a method of operating a memory system including a first memory bank and a second memory bank. Each memory bank includes an array of rows and columns of memory cells and an associated row decoder. The decoder of the first bank is provided with a full supply voltage in anticipation of selecting a row in the array of the first bank for access. The decoder of the first bank is then provided with a power-down supply voltage following access to that selected row. The decoder of the second bank is provided with the full supply voltage in anticipation of selecting a row in the array of the second bank for access. Finally, the decoder of the second bank is provided with the power-down supply voltage following access to the selected row in the array of the second bank.

The principles of the present invention provide substantial advantages over the prior art. In particular, because the principles of the present invention provide that the row decoder circuitry of a given memory system or device is never brought below a predetermined power-down supply voltage during the deactive period, the time required to turn on the circuit's transistors during the subsequent active period is substantially reduced. In particular, the time required for these transistors to transition from the turned off state to the ten percent of turn on state is substantially improved.

The foregoing has outlined rather broadly the features and technical advantages of the present invention in order that the detailed description of the invention that follows may be better understood. Additional features and advantages of the invention will be described hereinafter which form the subject of the claims of the invention. It should be appreciated by those skilled in the art that the conception and the specific embodiment disclosed may be readily utilized as a basis for modifying or designing other structures for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIG. 3 is a timing diagram depicting the timing relationships between selected signals controlling the memory circuitry of FIG. 2;

FIGS. 4A and 4B depict exemplary embodiments of the DC to DC converter circuitry depicted in FIG. 2; and FIG. 5 is a high level functional block diagram of a second embodiment according to the principles of the present invention in which the frame buffer is constructed with multiple banks of memory device.

DETAILED DESCRIPTION OF THE INVENTION

The principles of the present invention and their advantages are best understood by referring to the illustrated embodiment depicted in FIGS. 1–5 of the drawings, in which like numbers designate like parts. For purposes of illustration, the principles of the present invention will be described as implemented in a display system frame buffer constructed with DRAMs. It should be noted however that these principles may be applied to a number of differing memory devices and data processing systems as will become apparent from the discussion below.

Figure 1:
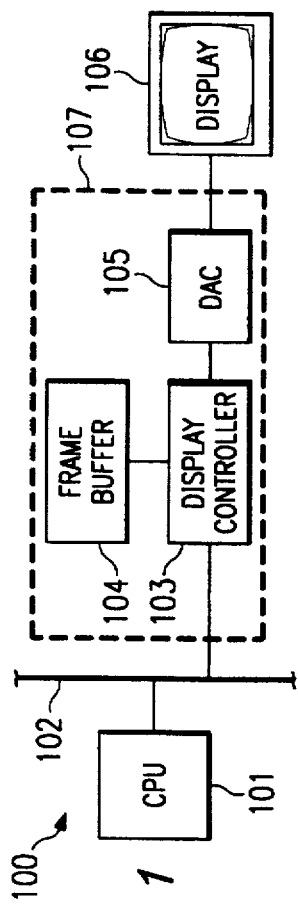
FIG. 1 is a high level functional block diagram of a display control system embodying the principles of the present invention.

FIG. 1 is a high level functional block diagram of the portion of a processing system 100 controlling the display of graphics and/or video data. System 100 includes a central processing unit 101, a system bus 102, a display controller 103, a frame buffer 104, a digital to analog converter (DAC) 105 and a display device 106. Display controller 103, frame buffer 104 and DAC 105 may fabricated together on a single integrated circuit chip 107 or on separate chips.

CPU 101 controls the overall operation of system 100, determines the content of graphics data to be displayed on display unit 106 under user commands, and performs various data processing functions. CPU 101 may be for example a general purpose microprocessor used in commercial personal computers. CPU 101 communicates with the remainder of system 100 via system bus 102, which may be for example a local ISA, VESA or PCI bus. DAC 105 receives digital data from controller 103 and outputs in response the analog data required to drive display 106. Depending on the specific implementation of system 100, DAC 105 may also include a color palette, YUV to RGB format conversion circuitry, and/or x- and y-zooming circuitry, to name a few options.

Display 106 may be for example a CRT unit or liquid crystal display, electroluminescent display (ELD), plasma display (PLD), or other type of display device displays images on a display screen as a plurality of pixels. It should also be noted that in alternate embodiments, "display" 106 may be another type of output device such as a laser printer or similar document view/print appliances.

Figure 2:
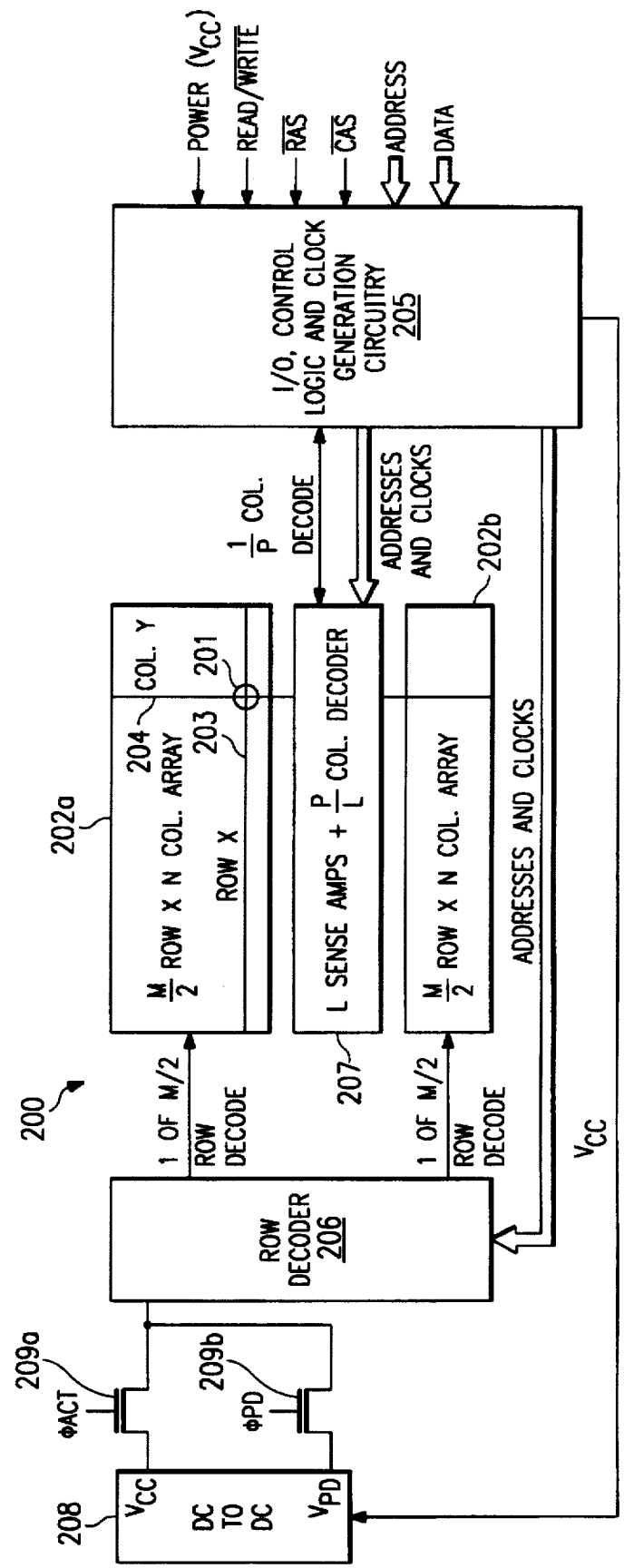
FIG. 2 is a more detailed functional block diagram of the frame buffer depicted in FIG. 1.

FIG. 2 is a functional block diagram of a dynamic random access memory (DRAM) 200 embodying the principles of the present invention. In the system illustrated in FIG. 1, DRAM 200 is used to construct frame buffer 104, however, it should be recognized that DRAM 200 is suitable for wide range of applications, and in particular to those applications requiring page mode accesses. DRAM 200 includes a plurality of storage locations 201 arranged in two arrays 202a and 202b. Each array 202 includes M/2 number of rows and N number of columns of dynamic memory cells 201, each cell 201 being disposed at the intersection of a row and a column. Each row is associated with at least one conductive row line (wordline) 203 and each column is associated with a conductive column line 204. A selected cell 201, row line 203 (associated with a row X) and column line 204 (associated with a column Y) are depicted in FIG. 1 for reference. Control circuitry 205 controls the input of addresses, the input and output of data, and the input of power ($V_{CC}$) and control signals, such as RAS, CAS and read/write select. Row decoding is controlled by row decoder 206 in response to received row addresses. In the illustrated embodiment, row decoder 206 is a conventional row decoder constructed from dynamic MOS circuitry and selects one row from either array 202a or 202b by charging the associated row line 203 to a positive voltage. Row decoder 206 pulls the row lines 203 of all the deselected rows to zero volts or ground. Column decoder/sense amplifier circuitry 207 is coupled to the bitlines 204 of each array 202a–202b. In the illustrated embodiment, circuitry 207 includes L number of sense amplifiers and a P/L column decoder. Preferably one sense amplifier is included for each of the N columns in the arrays 202 and 202b (i.e., L=N). It should be noted that the sense amplifiers may be multiplexed in alternate embodiments. For example, L may equal N/2 where each sense amplifier is switchable between a pair of bitlines 204. The P/L decoder of the illustrated embodiment couples one out of P columns with control circuitry 205 such that a single storage location 201 is accessed per address (i.e., the illustrated memory 200 is a "by 1" memory). It should be noted that memory 200 could be organized as a by 4, by 8, by 16 or similar memory. For example, the P/L decoder may be constructed to select 8 out of P columns/ sense amplifiers with control circuitry 205 such that 8 cells 201 can be accessed per address (i.e., memory 200 is a "by 8" memory).

According to the principles of the present invention, row decoder circuitry 206 is supplied with two different supply voltages, depending on whether DRAM 200 is in an active state (i.e RAS is low and read, write, or refresh operations are being performed) or in an inactive state (i.e. RAS is high). In the preferred embodiment, the conventional supply voltage $V_{CC}$, which is brought on-chip through circuitry 205, is switched to row decoder circuitry 206 during the active state and a smaller positive "power-down" voltage is switched to row decoder circuitry 206 during the inactive state. In this fashion, the transistors and critical nodes of row decoder circuitry 206 are no longer completely decoupled from a positive supply voltage and/or grounded as was done in the prior art. Preferably, the power-down voltage is derived from the conventional supply voltage $V_{CC}$ by DC to DC converter circuitry 208. In the illustrated embodiment, the switching is performed by transistors 209a and 209b in response to control signals $\phi_{ACT}$ and $\phi_{PD}$. Control signals $\phi_{ACT}$ and $\phi_{PD}$ may for example be generated on chip from RAS. The timing relationship between the conventional RAS and CAS signals and control signals $\phi_{ACT}$ and $\phi_{PD}$ for the preferred embodiment is set forth in the timing diagram of FIG. 3. Also in the preferred embodiment, the remaining circuitry (such as sense amplifiers and column decoder 207) of DRAM 200 is supplied from a single power supply source at the $V_{CC}$ voltage in a conventional fashion.

By maintaining row decoder circuitry 206 at a positive supply voltage, the turn-on time can be reduced once an active period is reached. Specifically, since a positive voltage is already maintained on the gates and/or the sources of the transistors of the critical paths, their gate and junction capacitances are maintained partially charged. These transistors consequently take substantially less time to turn on. For example, in a typical row decoder, each gate (on the average constructed with 3 or 4 transistors) turns on in approximately 0.6 nanosecond; the gates of row decoder circuitry 206 according to the principles of the present invention, can in theory turn on in as little as 0.3 nanosecond.

The power-down (intermediate) voltage can be generated in a number of ways. A typical voltage divider fabricated from resistors suitable for this purpose is shown in FIG. 4A. Alternatively, a voltage divider may be fabricated from enhancement MOSFETs as depicted in FIG. 4B. For example, assume that the memory device is operating at a nominal $V_{CC}$ voltage of 3.3 volts and that the effective threshold voltage of each enhancement field effect transistor is nominally 0.1 volt. Then, a series of 30 n-channel transistors with A=10 transistors and B=20 transistors will produce a power-down voltage ($V_{PD}$) of 1.1 volts.

FIG. 5 depicts an alternate embodiment of graphics/video processing system 100 in which frame buffer 104 is composed of two DRAM memory banks 200a and 200b. In this case, frame buffer 104 and controller 103 are preferably discrete units. Banks 200a and 200b are preferably interleaved. Controller 103 tracks the current row and column addresses and the bank selection data. Controller 103 then "looks ahead" to the next address which is directed to a row in the currently deselected bank. For example, assuming the current address is to bank 200a, the next address will be to a row in bank 200b. When a given bank 200a or 200b is not active, its row decoder circuitry 206 can be powered down to the power-down supply voltage $V_{PD}$ and when controller anticipates that the given bank will be addressed, can apply the full power supply voltage $V_{CC}$ thereto. It should be noted that each bank 200 may be provided with DC to DC converter circuitry 208 or alternatively, a single common DC to DC converter circuit 208 may be employed to supply the requisite voltages to both banks 200.

Although the present invention and its advantages have been described in detail, it should be understood that various changes, substitutions and alterations can be made herein without departing from the spirit and scope of the invention as defined by the appended claims.

What is claimed is:

1. A memory device comprising:
   an array of rows and columns of memory cells, each said row associated with a conductive wordline;
   row decoder circuitry coupled to each said wordline for selecting a said row of cells for access; and
   circuitry for providing a selected one of a plurality of supply voltages to said row decoder circuitry, said circuitry providing a first positive voltage during an active state of said decoder circuitry and providing a second positive voltage during an inactive state of said decoder circuitry.

2. The memory device of claim 1 wherein said array of cells comprises an array of dynamic random access memory cells.

3. The memory device of claim 1 wherein said second voltage is derived from said first voltage.

4. The memory device of claim 3 wherein said second voltage is derived from said first voltage using a resistor voltage divider.

5. The memory device of claim 3 wherein said second voltage is derived from said first voltage using a voltage divider constructed of field effect transistors.

6. A memory device operating in response to a predetermined device supply voltage comprising:
   an array of rows and columns of memory cells;
   a row decoder for accessing a selected one of said row of cells, said row decoder circuitry active during an active period of a row address strobe and inactive during an inactive period of said row address strobe;
   DC to DC converter circuitry operable to generate a power-down supply voltage from said device supply voltage; and
   circuitry for providing said device supply voltage to said row decoder during said active period and said power-down supply voltage to said row decoder from said converter circuitry during said inactive period.

7. The memory device of claim 6 wherein said DC to DC converter circuitry includes a resistor voltage divider.

8. The memory device of claim 6 wherein said DC to DC converter includes a voltage divider constructed of field effect transistors.

9. The memory device of claim 6 wherein said circuitry for providing includes a transistor for switching said power-down voltage from said converter circuitry to said decoder in response to a power-down control signal, said power-down control signal having an active period substantially equal to said inactive period of said row address strobe.

10. The memory device of claim 6 wherein said circuitry for providing includes a transistor for switching said supply voltage to said decoder in response to an active state control signal, said active state control signal having a period substantially equal to said active period of said row address strobe.

11. A data processing system comprising:
a controller;
a memory bank comprising an array of rows and columns of memory cells and row decoder circuitry for selecting a said row of cells for access; and
circuitry for providing a selected one of a plurality of supply voltages to said row decoder circuitry, said circuitry for providing a first positive voltage in anticipation of a selection by said decoder circuity of a row in the array for access and providing a second positive voltage during an inactive state of said decoder circuitry following access to the selected row.

12. The processing system of claim 11 wherein said controller comprises a display controller and said memory system comprises a frame buffer system.

13. The processing system of claim 11 wherein:
said processing system further comprises a second memory bank including a second array of rows and columns of memory cells and second row decoder circuitry for selecting a said row of cells in said array for access; and
said circuitry for providing further provides said first positive voltage to said second decoder circuitry in anticipation of a row selection by said second decoder circuitry and said second positive voltage to said second decoder circuitry during an inactive period of said second decoder circuitry.

14. The processing system of claim 11 wherein said controller and said memory system are integrated on a single chip.

15. The processing system of claim 11 wherein said array of memory cells comprises an array of dynamic random access memory cells.

16. A method of operating a memory device including an array of rows and columns of memory cells and row decoder circuitry for accessing the cells of a selected one of the rows, the method comprising the steps of:
providing a first positive supply voltage to the decoder circuitry during an active state of the decoder circuitry; and
providing a second positive supply voltage to the decoder circuitry during an inactive state of the decoder circuitry.

17. The method of claim 16 and further comprising the step of generating the second voltage from the first voltage.

18. The method of claim 17 wherein said step of generating comprises a step of generating the second voltage from the first voltage using a DC to DC conversion technique.

19. A method of operating a memory system including a first memory bank including an array of rows and columns of memory cells and an associated row decoder and a second memory bank including an array of rows and columns of memory cells and an associated row decoder, the method comprising the steps of:
providing the decoder of the first bank with a full supply voltage in anticipation of selecting a row in the array of the first bank for access;
providing the decoder of the first bank with a power-down supply voltage following access to the selected row in the array of the first bank;
providing the decoder of the second bank with the full supply voltage in anticipation of selecting a row in the array of the second bank for access; and
providing the decoder of the second bank with the power-down supply voltage following access to the selected row in the array of the second bank.

20. The method of claim 19 and further comprising the step of generating the power-down supply voltage from the full supply voltage.

* * * * *